United States Patent [19]

Maston, III et al.

[11] Patent Number: 5,109,981
[45] Date of Patent: May 5, 1992

[54] CARRIER AND CARRIER SYSTEM FOR FLATPACK INTEGRATED CIRCUITS

[75] Inventors: Roy E. Maston, III, Milford; Robert H. Murphy, Merrimack, both of N.H.

[73] Assignee: R. H. Murphy Company, Inc., Amherst, N.H.

[21] Appl. No.: 563,402

[22] Filed: Aug. 6, 1990

Related U.S. Application Data

[63] Continuation-in-part of Ser. No. 495,860, Mar. 19, 1990, Pat. No. 5,012,924.

[51] Int. Cl.$^5$ .................. B65D 73/02; H05F 3/00; H01H 47/00
[52] U.S. Cl. .................................. 206/331; 361/220
[58] Field of Search ............... 206/328, 329, 331, 334; 361/220

[56] References Cited

U.S. PATENT DOCUMENTS

| | | | |
|---|---|---|---|
| 3,746,157 | 7/1973 | I'Anson | 206/331 X |
| 4,026,412 | 5/1977 | Henson | 206/331 |
| 4,549,651 | 10/1985 | Alemanni | 206/331 X |
| 4,620,632 | 11/1986 | Alemanni | 206/331 X |
| 4,677,520 | 6/1987 | Price | 206/331 X |
| 4,706,161 | 11/1987 | Buckingham | 206/331 X |
| 4,725,918 | 2/1988 | Bakker | 206/331 X |
| 4,765,471 | 8/1988 | Murphy | 206/331 X |
| 5,000,697 | 3/1991 | Murphy | 206/331 X |

Primary Examiner—William I. Price
Attorney, Agent, or Firm—Pearson & Pearson

[57] ABSTRACT

A carrier adapted for diverse electrical and electronic components in flatpack packages to facilitate shipping, handling and testing of these components. The carrier frame supports the flatpack package with its housing and terminals in a central area of the carrier frame. A retention cover with depending legs interacts with the carrier frame outside the central area to lock the retention cover to the carrier frame. The retention cover has an open construction that facilitates access to the terminals for testing. A removal tool facilitates the release of the retention cover. The removal tool captures the carrier frame and allows the carrier frame to slide through the tool. A central structure in the removal tool deflects and releases the depending legs from the carrier frame thereby to release the retention cover.

20 Claims, 4 Drawing Sheets

CARRIER AND CARRIER SYSTEM FOR FLATPACK INTEGRATED CIRCUITS

CROSS REFERENCES TO RELATED APPLICATIONS

This application is a continuation-in-part of a copending U.S. Letters patent application Ser. No. 07/495,860 filed Mar. 19, 1990 for "Improved Carriers for Integrated Circuits" and assigned to the same assignee as this invention, now U.S. Pat. No. 5,012,924, issued May 7, 1991.

Reference is also made to a copending U.S. Letters patent application Ser. No. 07/499,926 filed Mar. 27, 1990 for "Carrier System for PGA Electrical Components", also assigned to the same assignee as this invention now U.S. Pat. No. 5,009,697 issued Mar. 19, 1991.

BACKGROUND OF THE INVENTION

1. Field of the Invention

This invention generally relates to carriers for integrated circuits and the like and more specifically to such carriers that, during manufacture and assembly operations position such circuits, protect them from mechanical and electrical damage and facilitate their testing. More particularly, this invention relates to the structure of a retention system for securing an integrated circuit in such a carrier and tooling for facilitating the removal of the retention means from the carrier.

2. Description of Related Art

Semiconductor devices have matured from simple circuit elements into complex components, and this maturation has been accompanied by an increase in the complexity of handling these components during assembly and testing operations. For example, simple, discrete components such as transistors, diodes and the like, either were soldered directly into a circuit or were held in component sockets to facilitate replacement. With the advent of more sophisticated assembly equipment and procedures, it became advantageous to position these devices mechanically and then to solder groups of terminals associated with plural components to a circuit board during a single soldering operation. When these circuit boards failed, it was still possible to replace individual components because the replacement procedures were straightforward as each component had only a few terminals that could be cut and removed.

With current technology, semiconductor devices include expensive integrated circuits and like components with a large number of terminals. These integrated circuits often are located on multiple layer circuit boards. They have become subject to damage from a number of external influences such as mechanical shock and discharges of accumulated electrostatic charge. Thus, the procedures for handling such components are critical. Moreover, the increased density of such components on circuit boards and their costs have led to the development of component testing prior to assembly. These procedures are also necessary because in many situations it no longer is economically feasible to replace defective components. Often an entire circuit board with a number of valuable integrated circuits may be discarded even if a single component on the board fails.

The need to protect integrated circuits and test them individually led to the advent of chip carriers. Chip carriers are special enclosures or packages that house an integrated circuit or the like during processing, production, testing and assembly operations. More specifically, a typical chip carrier orients an integrated circuit during the production process and assures proper placement and alignment of terminals for testing and for insertion into a printed circuit board. They eliminate stresses from the terminals and seals in such integrated circuits. More recently, chip carriers have been constructed to dissipate electrostatic charges that otherwise can accumulate on a component. There are several general approaches to the chip carrier design that seek to provide these various functions.

In accordance with one general approach, a carrier body supports an integrated circuit. An electrical shorting mechanism or insert contacts all the terminals to dissipate any electrostatic charge. Other mechanisms displace the shorting mechanism or insert from the terminals during testing operations. The following United States Letters Patents depict various specific embodiments that incorporate this general approach.

| | | |
|---|---|---|
| 3,653,498 | (1972) | Kisor |
| 3,746,157 | (1973) | l'Anson |
| 4,026,412 | (1977) | Henson |
| 4,549,651 | (1985) | Alemanni |
| 4,620,632 | (1986) | Alemanni |
| 4,706,161 | (1987) | Buckingham |
| 4,725,918 | (1988) | Bakker |

Kisor discloses a carrier formed of a carbon-embedded plastic with a shorting member that contacts all the terminals. The shorting member must be removed prior to testing. L'Anson discloses an analogous structure with a shorting member that falls away from the terminals during testing. Buckingham discloses a shorting bar held across accessible terminals; the bar is withdrawn for testing. Bakker discloses a chip carrier with an insert that avoids electrostatic discharges; the insert must be removed before testing occurs.

An insulating base member in Henson supports an integrated circuit housing on a metallic heat sink; a cover overlies the housing The insulting base member supports extensions of the terminals that extend beyond the cover. Alemanni discloses a carrier for a pin grid array (PGA) circuit with a base member having a plurality of apertures formed through removable carrier inserts to adapt the carrier to a variety of packages. The Alemanni patents disclose one- and two-part chip carriers for PGA integrated circuits or components. The one-part chip carrier includes a thin flat base within an outer frame. Retention fingers overlap and engage the bottom face of a PGA component package to capture the package in the carrier. In the two-part chip carriers, a separate plate structure with retention fingers for a PGA component of a given size replaces the integral base. Retention fingers in the frame capture the separate plate structure. The two-part chip carrier allows a single outer frame to accommodate plates for a range of PGA component sizes.

U.S. Letters Pat. No. 4,765,471 of Robert Murphy, that is titled Electrical Component Carrier and assigned to the same assignee as the present invention, discloses a chip carrier for PGA components that comprises an outer frame with a centrally disposed laminated plate comprising conductive and nonconductive materials. Apertures through the laminated plate receive the PGA terminals and isolate them from the conductive layers of the plate. The outer frame extends around the periphery of the plate to the protect the component and its terminals from mechanical damage. There are a plurality of cantilevered arms adjacent a central opening through a retainer; and these arms lock the PGA component against the laminated plates. Locking posts at opposite ends of the retainer engage latches formed on the outer frame and secure the retainer to the frame thereby to sandwich the PGA component therebetween.

These systems are somewhat difficult to utilize, particularly in fully automated production lines. In the Alemanni patents, special tooling must spread the four retention fingers apart and simultaneously allow a vacuum head to position the PGA component in proper alignment with the terminal apertures through the plate. A similar procedure locates the PGA chip on the insert plate on the two-part carrier. When one positions the insert inside the frame and forces the insert toward the base of the frame, lever arms cam outwardly and allow the flange tips of clips to return and capture the insert. In the Murphy patent, the locking posts align along an axis along which the chip carrier normally travels. This retention system is subject to being dislodged if the carrier receives a shock along that axis. In all these carriers, one must centrally locate the PGA component with respect to the supporting plate. Moreover, one must take care to avoid the introduction of undo stresses to the PGA component particularly during transport. Otherwise, the terminals can bend or hermetic seals can break open.

In accordance with my U.S. Letters Pat. No. 5,009,967, a carrier system specially constructed for PGA integrated circuits comprises a chip carrier and one or both of a locator tool and a removal tool. The chip carrier includes a carrier frame means having a planar plate for supporting the pin grid array component in a plurality of apertures through which the PGA component terminals pass. A peripheral skirt transverse to the plate defines upper and lower nested cavities that protect the component housing and the terminal pins respectively. Shock absorbing means extend across one or both of two parallel ends of the peripheral skirt and absorb impact stresses that can occur during transport. Engagement means formed at the edges of the plate coact with a second engagement means formed in a removable retaining means. The retaining means overlies the component and holds the component in place.

A system removal tool constructed in accordance with that disclosure has a frame for positioning the chip carrier in the tool and transverse finger means that contact the engagement means on the carrier frame as the carrier frame is inserted in the tool. These finger means then deflect the engagement means to free the removable retaining means.

It is not possible, however, to adapt these configurations to carriers for integrated circuits in flatpack packages. A central rectangular or square ceramic body and terminals emanating from each side of the ceramic body in the plane of the body characterize integrated circuits in flatpack packages. Whereas in a PGA carrier, the terminals are accessible from the bottom of the carrier, the flatpack configuration requires accessibility from the top of the carrier. As a result, if a PGA carrier transports its chip "on top" of a supporting structure, a carrier for a flatpack integrated circuit carries the integrated circuit below the supporting carrier structure. Automated production lines typically move the carriers along a route in a line. The PGA system requires the carrier to move transversely to the line so it nests within the removal tool. Such transverse motion can complicate the production line and reduce production throughput involving flatpack components.

SUMMARY OF THE INVENTION

Therefore it is an object of this invention to provide a carrier system for integrated circuits in flatpack packages adapted for automated circuit production.

Yet another object of this invention is to provide a carrier system for integrated circuits in flatpack carriers that facilitates the removal of the component from the carrier system.

In accordance with one aspect of this invention, a carrier system for integrated circuits in flatpack packages comprises a carrier frame and a retention cover for securing the package to the carrier frame. The flatpack package has a planar central housing and a plurality of terminals emanating from the periphery of the planar housing. The carrier frame supports the flatpack package housing and terminals in a central area. Slots extend through the carrier frame at locations outside the central area. The retention cover includes a central, open frame that engages the periphery of the planar housing and depending legs that engage the slots in the carrier frame to lock the retention cover in place and to secure the package to the carrier frame. Diagonal beams from the open frame space the depending legs from the open frame means to provide free access to the housing and terminals of the flatpack package.

In accordance with another aspect of this invention, a removal tool facilitates the release of the retention cover from the carrier frame as it moves along a production line. The removal tool includes a base that extends along the production line. Spaced capture channels on the base enable the carrier frame to slide through the removal tool. Camming surfaces intermediate the capture channels force deflect extension of the depending legs to release the legs and the retention cover from the carrier frame.

BRIEF DESCRIPTION OF THE DRAWINGS

This invention is pointed out with particularity in the appended claims. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
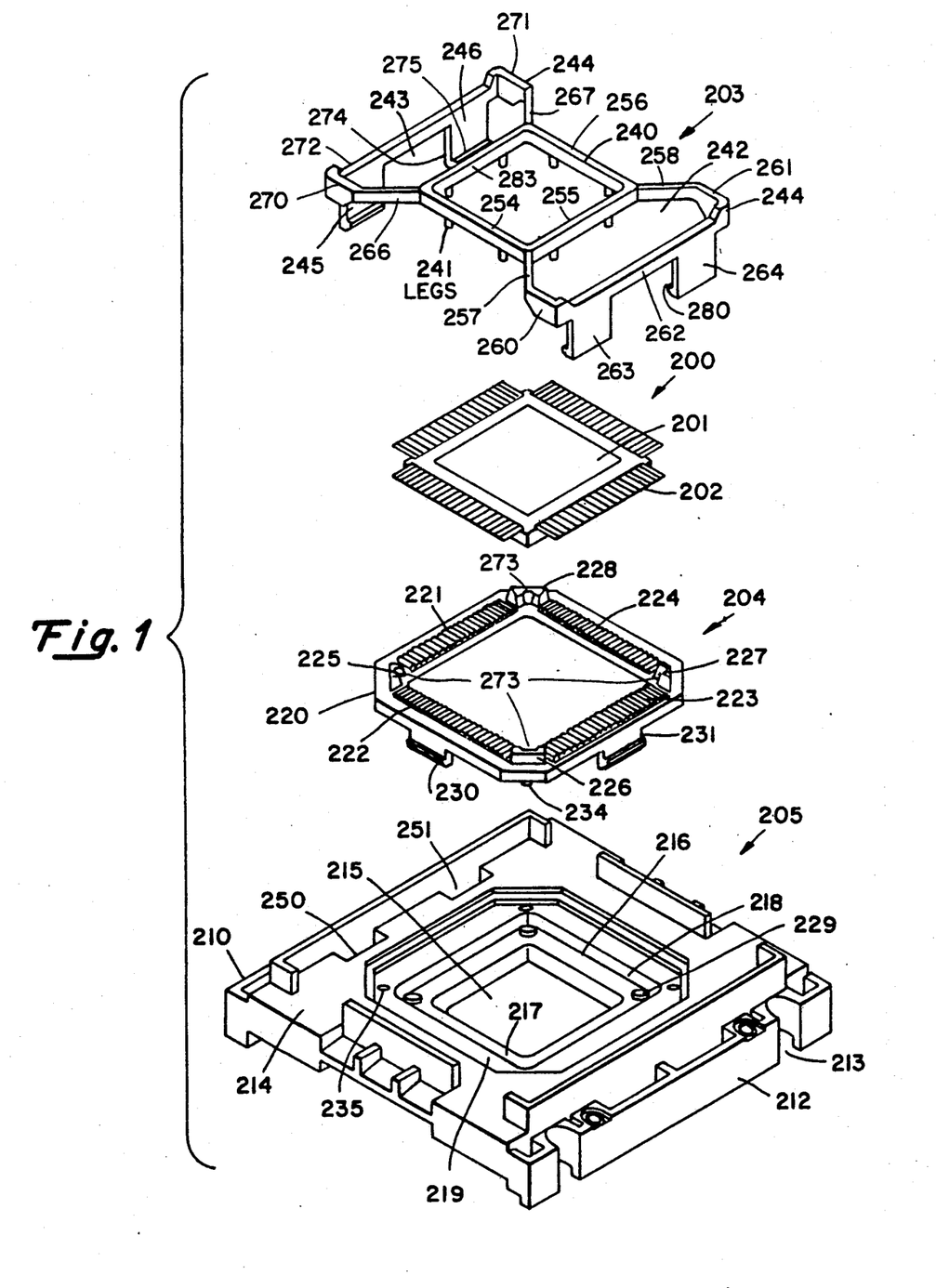
FIG. 1 is an exploded view in perspective of one type of flatpack integrated circuit and a chip carrier constructed in accordance with this invention.
Figure 2:
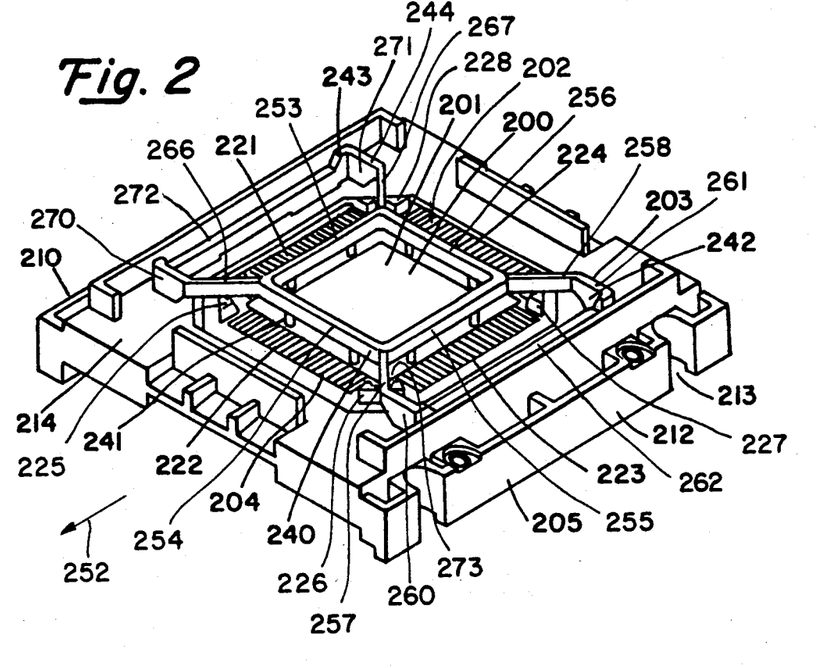
FIG. 2 is a perspective view of the elements of FIG. 1 in assembled form.
Figure 3:
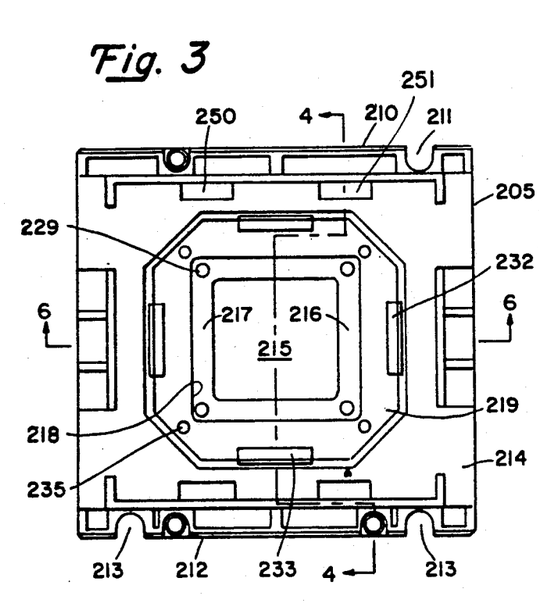
FIG. 3 is a top view of the carrier shown in FIGS. 1 and 2.
Figure 4:
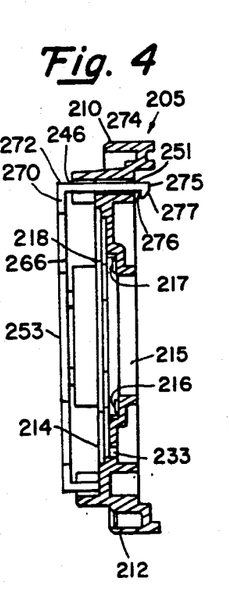
FIG. 4 is a sectional view of the carrier taken along lines 4—4 in FIG. 3.
Figure 5:
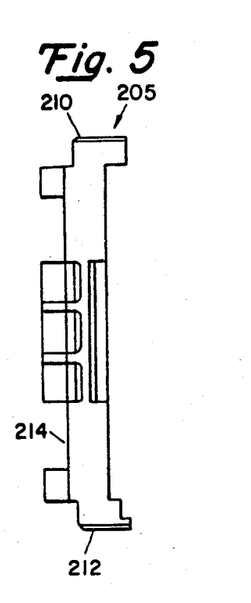
FIG. 5 is a side view of the carrier shown in FIGS. 1 and 2.

FIGS. 1 through 9 depict a carrier that utilizes a retention device constructed in accordance with this invention. Referring to FIGS. 1 and 2, a flatpack component 200 typically comprises a ceramic housing 201 and a plurality of terminals 202 extending from the edges thereof, typically in a horizontal plane.

A carrier embodying this invention and adapted for use with such flatpack components includes a retention cover 203, a nonconductive insert 204, and a conductive base or frame 205. The retention cover 203 and frame 205 typically are composed of any of a wide variety of easily molded, conductive and thermally and dimensionally stable materials. Filled polyether sulfones are preferred while polyether imides, polyaeryl sulfones and polyesters are also examples of suitable materials. Aluminum and carbon constitute acceptable conductive fillers. The insulating insert 204 typically is molded with the same materials as the retention cover 203 and frame 205, except that the conductive filler is omitted.

Referring particularly to FIGS. 1 through 5, the conductive frame 205 includes a first side rail 210 with notches 211 and a second side rail 212 with notches 213. The side rails 210 and 212 with their respective notches 211 and 213 provide a means for enabling external tooling to engage and manipulate the conductive frame 205, as described hereinafter.

The frame additionally includes an internal central body portion 214 between the side rails 210 and 212. The body portion 214 has a square through-hole 215 and a circumscribing lower cavity 216 formed by a step or base 217 and riser 218 around the periphery of the cavity. An upper cavity 219 conforms to the outline and depth of the insulating insert 204.

Figure 7:
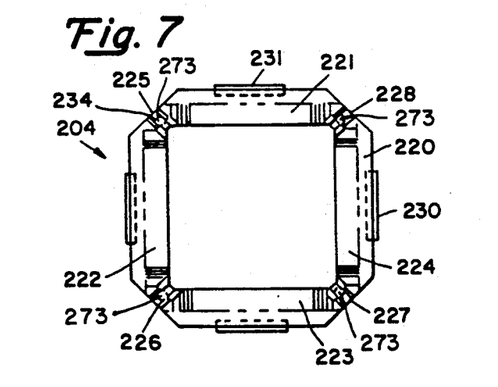
FIG. 7 is a top view of an insert for the carrier shown in FIGS. 3 through 6.
Figure 8:
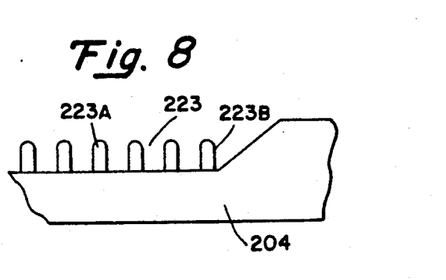
FIG. 8 is a detail of a portion of the insert shown in FIG. 7.

Referring particularly to FIGS. 1 and 7, the insulating insert 204 includes an open frame 220 dimensioned to nest in the cavity 216 and abut the riser 218. The interior portion of the open frame 220 has a plurality of comb surfaces 221 through 224, the comb surface 223 being shown in detail in FIG. 8. Upstanding insulating fingers 223A form surfaces 223B that separate and isolate terminals 202 that extend horizontally from the housing 201.

There are two alternatives for supporting a flatpack component in the carrier 205. In accordance with one such alternative, the insulating insert 204 also has four notched structures 225 through 228 at the corners. These corner structures may engage and support the corners of the housing 201 and constitute first surfaces for supporting the component. In accordance with the other alternative, the housing 201 extends through the opening in the frame 200 to rest on a series of buttons 229. One button 229 extends vertically at each corner of the step 217. These buttons 229 engage the bottom of the ceramic housing 201. Although the buttons 229 are conductive, the circuitry in the housing 201 is isolated from the conductive frame 205 because the ceramic housing 201 constitutes an insulating barrier.

Figure 6:
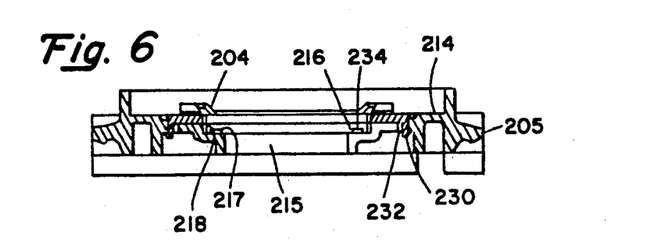
FIG. 6 is a sectional view taken along line 6—6 in FIG. 3.

The insert 204 additionally includes a series of depending legs, such as legs 230 and 231 shown in FIGS. 1, 6 and 7. These depending legs register with rectangular apertures such as apertures 232 and 233 shown in FIGS. 3, 4, and 6. The legs and apertures provide a snap connection between the insulating insert 204 and the conductive frame 205. A plurality of buttons 234, shown in phantom in FIG. 7, extend downwardly at the corners of the insert 204. These buttons 234 act as locating pins that engage corresponding apertures 235 formed in the bottom surface of the upper cavity 219 on the bottom of the insert 204. The use of the snap-in insert enables a single conductive frame 205 and retention cover 203 to accept a plurality of flatpack components. For example, it is only necessary to change the insert 204 to adapt the carrier specifically shown in FIGS. 1 through 9 for a flatpack package of a modified configuration.

Thus, when the flatpack component 200 is placed on the insert 204 in the conductive frame 205, the corners 225 through 228 constitute first surfaces that engage and support the component housing 201. The comb surfaces, including the areas between fingers such as the finger 223A shown in FIG. 8, define second surfaces that isolate and support the individual terminals 202 extending from the housing 201. The riser 218 about the periphery of the cavity 216 abuts the insert 204, and the step 217 underlies and engages the bottom of the insert 204 thereby to position and to overlay the insulating material surfaces, other than the nonconductive surface that supports the component terminals 202.

During the handling and testing of flatpack components 200, the carrier often is inverted from the position shown in FIG. 2. It therefore is necessary to provide a positive retention device, and such a device must have several characteristics. First, the retention device must hold the flatpack package in place in any carrier orientation in space. The retention device must maintain the component in place even when external forces shock or stress the carrier. The retention device must provide ready access to all the terminal leads for component testing purposes and not transfer forces to the component that could cause the component to twist in its plane. The retention device must be easy to attach and remove and particularly be adapted for removal operations that occur "in-line" as the carrier moves along a processing line, rather than being stopped to allow an external tool to unlock the retention device from the carrier.

The retention cover 203 constructed in accordance with this invention meets all these criteria. As shown particularly in FIG. 1, the retention device comprises an open cover that includes a central open frame structure 240 with a plurality of depending legs 241 that engage the top of the housing 201. Outrigger sections 242 and 243 each include a frame 244 and a pair of depending legs 245 and 246. These legs engage the conductive frame when they pass through slots 250 and 251 shown in FIGS. 1 and 3. They are formed to snap into the frame 204. As will be apparent from FIG. 2, the retention cover 203 therefore locks in to the frame 205 to retain the flatpack component 200 in the carrier frame 205. However, the terminals 202, that lie on top of the comb surfaces 221 through 224, so they are electrically insulated from each other and from the frame and are readily accessible for testing purposes.

It will also be apparent that the cover 204, by virtue of being locked to the frame 205, keeps the component 200 in place even if the carrier shown in FIG. 2 is inverted. A carrier normally moves along a path designated by arrow 252 in FIG. 2, and forces due to impact and other causes normally act parallel to the arrow 252. The retention cover 203 remains locked in the frame 205 when such forces occur because it requires forces oppositely directed at right angles to the arrow 252 to deflect the depending legs, such as legs 245 and 246 in FIG. 1, and release them from the frame 205.

As evident from FIGS. 1 and 2, the cover comprises a series of narrow webs or beams to achieve its open structure for testing. Specifically, the open frame 240 comprises a set of four inner beams 253, 254, 255 and 256. The outrigger section 242 comprises two diagonal beams 257 and 258 that extend from the corners of the inner beams 254. External extension beams 260 and 261 extend from these diagonal beams 257 and 258, respectively, and support a transverse beam 262. The transverse beam 262 supports depending legs 263 and 264 that are analogous to legs 245 and 246. The outrigger extension 243 has a similar structure and includes diagonal beams 266 and 267 extending from the inner beam 253. External extensions 270 and 271 support a transverse beam 272 that supports the depending legs 245 and 246.

This integrally molded structure is stable dimensionally and withstands the influences of external forces. The diagonals 257, 258, 266 and 267 further interact with the insulating insert 204 to assure that external forces on the retention cover 203 do not transfer as force moments to the component 200. Any such moments could twist the component 200 and bend the terminals 202. As shown in FIGS. 1, 2 and 7 each of the notched structures 225, 226, 227 and 228 has a narrow slot 273 aligned along a diagonal. When the retention cover 203 locks in place, the diagonal beams 257, 258, 266 and 267 lie in the slots 273 of corresponding ones of the notched structures 226, 227, 225, and 228. The notched structures engage the diagonal beams so that the open frame structure 240, particularly the depending legs 241, can not twist relative to the insulating member 204. This prevents the transfer of any force moments in the plane of the component 200 to the component 200.

Figure 9:
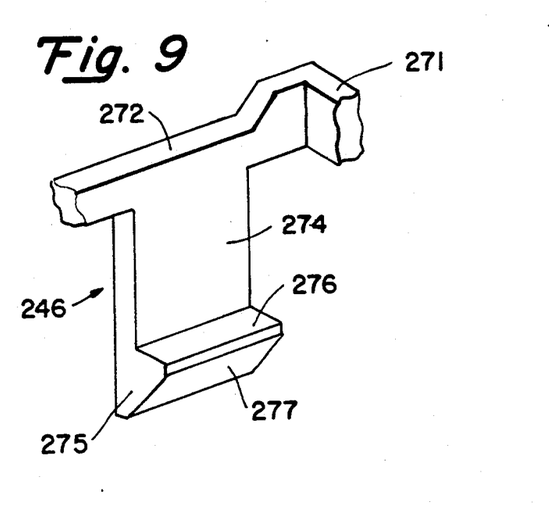
FIG. 9 is an enlarged perspective view of a portion of a retention means constructed in accordance with this invention.

All the depending legs 245, 246, 263 and 264 have the same structure, so the following discussion is limited to a detailed description of the depending leg 246 as shown in detail in FIG. 9. Referring to FIGS. 1 and 9, a downwardly extending rectangular body portion 274 from the beam 272 terminates in an inwardly extending, transverse lip portion 275. The lip portion 275 faces the center of the retention cover 203. The thickness of the rectangular body 274 and lip portion 275 is less than the width of the corresponding slot 251 through the frame 205 so the depending leg can pass easily through the slot 251. The lip portion 275 also has a surface 276 that engages the frame 205 adjacent the slot 251 and a lower oblique surface 277 that acts as a camming surface. Referring to FIG. 1, the dimension between the oppositely facing inner surfaces of transverse beams 262 and 272 in a relaxed condition corresponds to the distance between the inner edges of the slots, such as slots 251 and the corresponding slot on the other side of the frame 205. As the retention cover 203, as shown in FIG. 1, moves to the position in FIG. 2, the inner edges of the frame adjacent the slots, such as slot 251, engage the camming surfaces 277 on each of the legs, such as leg 246, and deflect them outwardly until the lips, such as lip 275, enter the corresponding slots. In this orientation, the retention cover 203 generates internal forces. Additional downward force advances the retention cover 203 toward the component. As this occurs the legs pass through their respective slots until the legs 241 contact the flatpack component 200.

The distance between a plane across the bottoms of the legs, such as leg 241 and the surface 276 corresponds to the distance between the top of the component 200 and the lower surface adjacent the slot 251. Thus, as the legs 241 contact the component 200, the lips, such as lips 275, extend beyond the carrier frame 205. The internal forces then snap the legs, such as legs 246, to the position shown in FIG. 4 thereby locking the retention cover 203 to the carrier 205.

It now can be seen that the carrier 205 and the retention cover 203 achieve several objectives of this invention. Particularly, the positive locking between the depending legs 245, 246, 263 and 264 enables the retention cover 203 to hold a component 200 in place positively in any carrier orientation in space. As the depending legs 245, 246, 263 and 264 lie in planes parallel to the direction of motion and as external shock forces will tend to act parallel to that axis, external shock forces will not act to unlock the retention cover 203 from the carrier 205 because they act as right angles to the deflection of the legs. As shown in FIG. 2, the leads are fully exposed for testing through the open frame. The interlocking of the various diagonals 257, 258, 266 and 267 with the respective ones of the notched structures 225, 226, 227 and 228 minimize the transfer of any forces to the component 201 that coupled cause the component 201 to twist with respect to the carrier 205. Finally, as will be apparent, the retention cover 203 is readily attached merely by lowering it into position.

Figure 10:
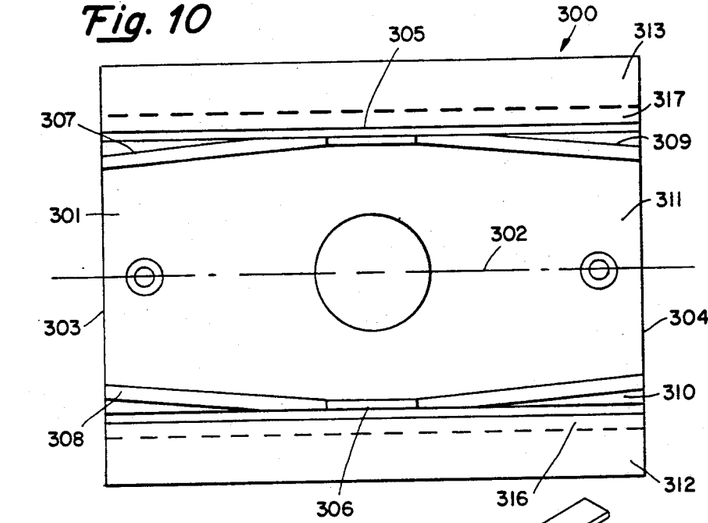
FIG. 10 is a top plan view of a removal tool constructed in accordance with this invention.
Figure 11:
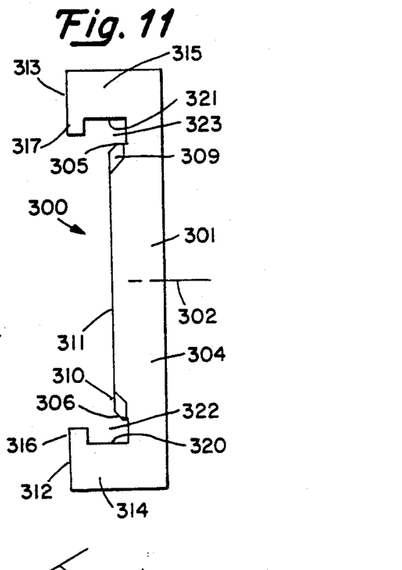
FIG. 11 is an end plan view of the removal tool shown in FIG. 10.

In accordance with another aspect of this invention, a removal tool 300 as shown in FIGS. 10 and 11 facilitates the separation of the retention cover 203 and the carrier 205. This particular embodiment of a removal tool 300 has an elongated base 301 that extends along an axis 302. The axis 302 aligns with the axis 252 in FIG. 2 along which the carrier travels. A central portion of the base 301 has an irregular, octagonal shape with ends 303 and 304, short, parallel and centered sides 305 and 306, first oblique sides 307 and 308, and second oblique sides 309 and 310. The corners formed by these various sides and a top surface 311 of the central base 301 are chamfered.

The removal tool 300 also has parallel elevated rails 312 and 313 extending from a base on upstanding legs 314 and 315. The legs 314 and 315 terminate with inwardly directed horizontal lips 316 and 317 respectively.

The spacing between counter facing surfaces 320 and 321 on the legs 314 and 315 corresponds to the outer dimensions between the skirts 210 and 212 shown in FIG. 1. As shown in FIGS. 10 and 11, the lips 316 and 317 form channels, generally designated by reference numerals 322 and 323, having a height corresponding to the height of the peripheral skirts 210 and 212 in FIG. 1. With these dimensions, the removal tool 300 captures the skirts 210 and 212 in the channels 322 and 323 (vertically in the orientation of FIGS. 10 through 12) while allowing the carrier 205 to slide easily along the axis 302 from one end 304 of the tool to the other end 303 of the tool or in the reverse direction. As the carrier 205 passes through the removal tool 300, the chamfered corners between the top surface 311 and the various sides release the retention cover 203 from the carrier 205. Thus the removal tool 300 is adapted for insertion "in-line" in a production facility.

Figure 12:
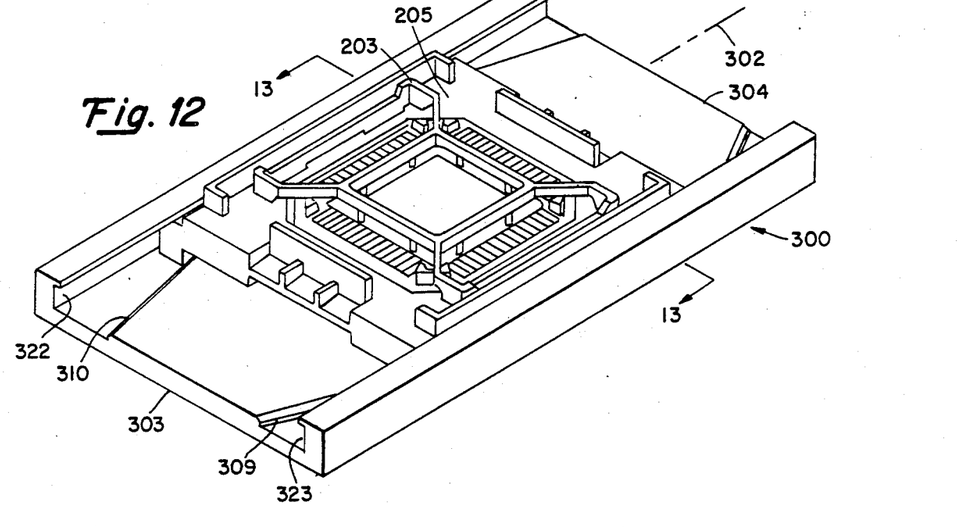
FIG. 12 is a perspective view of the removal tool shown in FIGS. 10 and 11 with a carrier as shown in FIGS. 1 through 8.
Figure 13:
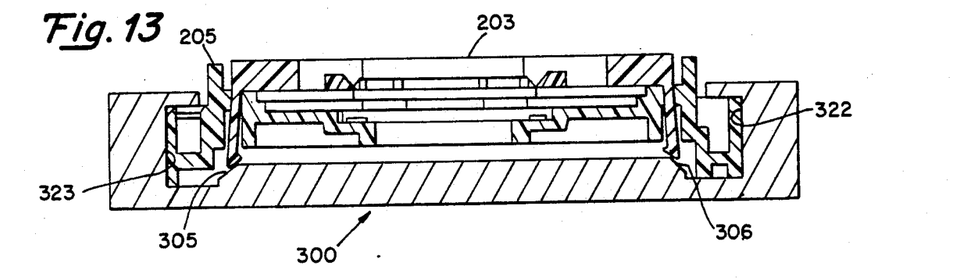
FIG. 13 is a cross section along lines 13—13 in FIG. 12.

FIGS. 12 and 13 facilitate the understanding of the interaction among the removal tool 300, the carrier 205 and the retention cover 203. FIG. 12 specifically depicts the carrier 205 at a position along the axis 302 where maximum deflection of the legs 246 and 264 in FIG. 1 occurs. As the carrier 205 moves along the axis 302, the distance between the oblique surfaces 309 and 310 increases until the legs 246 and 274 reach the central sides 305 and 306 as shown in FIG. 13. As the carrier 205 moves, therefore, the surfaces 309 and 310 eventually contact the cam surfaces 277 on each of the depending legs 246 and 264. Further displacement of the carrier 205 in the channels 322 and 323 causes the surfaces 309 and 310 begin to deflect the legs 246 and 264 outwardly by applying a horizontal (in FIG. 13) force component to the legs. When the legs 246 and 264 then reach the central sides 305 and 306, the legs 246 and 264 align, respectively, with the aperture 251 and a corresponding aperture on the opposite side of the carrier 205.

In addition the interaction of the chamfered surfaces formed at the central sides 305 and 306 and the oblique cam surfaces 277 on the legs 246 and 264 produce an upward force component. This upward force component displaces the retention cover 203 upwardly until the lip portion 275 on each of the depending legs 246 and 264 moves into the corresponding slot of the carrier 205, such as the slot 251 for the depending leg 246. This releases the legs 246 and 264 from their locked positions. Further motion along the axis 302 causes a similar interaction with the depending legs 246 and 263 so that they lie in the slots such as slot 250. When the carrier 205 then leaves the removal tool 300, retention cover 203 is released from the carrier 205. Other automated machinery then can easily lift the retention cover 203 from, the flatpack component 200 downstream from the removal tool 300. Thus in accordance with another aspect of this invention, the carrier 205 and retention cover 203 together with the removal tool 300 form a system that facilitates the removal of the retention cover 203 particularly in in-line automated production facilities.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope and this invention.

What is claimed as new and desired to be secured by Letters Patent of the United States is:

1. Apparatus for supporting an electronic component having a housing and a plurality of terminals emanating from the housing, said apparatus comprising:
   A. carrier frame means having component support means for supporting the housing and terminals in a central area thereof and having first engagement means located beyond the support area, and
   B. retention cover means for securing the component to said component support means including central, open frame means for engaging the component housing, second engagement means for securing said retention cover means to said first engagement means, and diagonal beam means emanating from said open frame means for spacing said second engagement means from said open frame means to align with said first engagement means whereby said retention cover means provides free access to the electronic housing and terminals.

2. Apparatus for supporting an electronic component as recited in claim 1 wherein the component housing is rectangular, said open frame means having a corresponding rectangular shape for engaging the component housing, said retention cover means having first, second, third and fourth diagonal beam means emanating from the corners of said open frame means and said second engagement means comprising first and second frame members connected to said first and second and to said third and fourth diagonal beam means respectively thereby to parallel said first and second frame members, said diagonal beams means spacing said first and second frame members from said open frame means whereby said diagonal beams means and first and second frame members circumscribe terminals emanating form opposite sides of the electronic component housing.

3. Apparatus for supporting an electronic component as recited in claim 2 wherein said first engagement means comprises slot means formed at predetermined positions in said component support means at locations beyond the support area and wherein second engagement means additionally comprises depending engagement means extending from said first and second frame means, respectively, and in positions corresponding to the positions of said slot means.

4. Apparatus for supporting an electronic component as recited in claim 3 wherein each said depending engagement means comprises a depending body portion having a proximate end connected to one of said frame member means and lip means at the distal end of said body portion for engaging said component support means at a corresponding one of said slot means.

5. Apparatus for supporting an electronic component as recited in claim 4 wherein said apparatus is adapted for motion along an axis, said body portions in each of said second engagement and the corresponding ones of said slot means being aligned parallel to said axis and said body portions being flexibly connected to said respective frame member means for deflection in a direction transverse to said axis to disengage from said first engagement means.

6. Apparatus for supporting an electronic component as recited in claim 5 wherein said carrier frame means includes notched structure means positioned at each corner of the electronic component intermediate the terminals emanating from each side of the electronic component, said diagonal beam means engaging said notched structure means when said first and second engagement means lock said retention cover means to said carrier frame means.

7. Apparatus for supporting an electronic component as recited in claim 6 wherein said open frame means includes spaced contact means for engaging the component housing.

8. A removal tool means for use with a support system for supporting an electronic component characterized by a planar housing and a plurality of terminals extending therefrom, the support system including carrier frame means for supporting the electronic component at a central area thereof, the carrier frame means having a plurality of slots formed therethrough beyond the central area, and retention cover means for clamping the electronic component to the carrier frame means, the retention cover means having a plurality of sets of leg means depending therefrom and having extensions thereof aligned for extension through the slots in a carrier frame means, the leg mean sin a given set being deflected about an axis through the set to a stressed condition, the leg means, in a relaxed position, affixing the retention cover means to the carrier frame means and extending beyond the slots, said removal tool means being adapted for releasing the retention cover means from the carrier frame means and comprising:
   A. base means extending along an axis,
   B. spaced capture means connected to said base means for receiving the carrier frame means in a slidable relationship to said removal tool means, the carrier frame means sliding through said removal tool means along the axis, and
   C. camming means connected to said base means intermediate said capture means for deflecting the extensions of the leg means to release the leg means from said carrier frame means.

9. A removal tool means as recited in claim 8 wherein the leg means in each set lie parallel to the axis and each set has counterfacing leg means, the extensions of the leg means including counterfacing camming surfaces, said removal tool camming means including symmetrically oblique surfaces with respect to the axis elevated above said base means that intersect beyond the end of said removal tool, the distance between said oblique surfaces and the camming surfaces decreasing as the carrier frame means moves along the axis, said symmetrically oblique surfaces engaging and displacing the counterfacing camming surfaces on the leg means.

10. A removal tool means as recited in claim 9 wherein the leg means having counterfacing lip means for overlapping the carrier frame means adjacent the slots when the leg means are in their relaxed states, said symmetrically oblique surfaces, at their maximum displacement with respect to the axis, deflecting and separating the leg means to align with the slots, the interaction between the leg means and said symmetrically oblique surfaces applying horizontal and vertical force components to the leg means.

11. A removal tool means as recited in claim 10 wherein the carrier frame means has a central planar portion for supporting the electronic component and transverse edge portions parallel to the axis and terminating in a plane that is displaced away from the plane of the extensions of the leg means, said spaced capture means including upstanding leg portions along the length of said removal tool parallel to the axis displaced from each other by a distance corresponding to the width of the carrier frame means and counterfacing lip means for overlying the transverse edge portions thereby to limit any motion of the carrier frame means normal to the base means.

12. A removal tool as recited in claim 11 wherein camming means comprises a raised portion about the axis having an irregular octagonal shape about the axis that includes the symmetrically oblique surfaces, said raised portion having symmetry about both the axis and another axis transverse thereto and centered on said removal tool whereby said removal tool release the retention cover means from the carrier frame means as the carrier frame means passes through said removal tool in either direction.

13. A system for supporting an electronic component in a flatpack package characterized by a planar housing and a plurality of terminals extending therefrom, said system comprising:
   A. carrier frame means for supporting the electronic component in a central area thereof, said carrier frame means having a plurality of slots formed therethrough from said central area,
   B. open frame retention cover means for clamping the electronic component to said carrier frame means, said retention cover means having
      i. means for engaging the flatpack package housing at the periphery thereof,
      ii. a plurality of sets of depending legs for extending through said slots in carrier frame means, and
      iii. outrigger frame means interconnecting said depending legs and said open frame means and being disposed about the periphery of the flatpack package terminals, said legs in a given set being capable of deflection about said outrigger frame means and an axis through said set to affix said retention cover means to said carrier frame means when said legs extend beyond said slots when said retention cover means is affixed to said carrier frame means, and
   C. removal tool means for releasing said retention cover means from said carrier frame means, said removal tool means including:
      i. base means extending along an axis,
      ii. spaced capture means connected to said base means for receiving said carrier frame means in a slidable relationship to said removal tool means, said carrier frame means sliding through said removal tool means along the axis, and
      iii. camming means connected to said base means intermediate said capture means for deflecting, and releasing said depending legs from said carrier frame means.

14. A system for supporting an electronic component in a flatpack package as recited in claim 13 wherein the flatpack package housing is rectangular, said open frame means having a corresponding rectangular shape for engaging the periphery of the component housing, said retention means having first, second, third and fourth diagonal beam means emanating from the corners of said open frame means and said second engagement means comprising a first frame member connected to said first and second diagonal beam means and a second frame member connects the said third and fourth diagonal beam means thereby to parallel said first and second frame members, said diagonal beams means spacing said first and second frame members from said open frame means whereby said diagonal beams means and first and second frame members circumscribe terminals emanating from opposite sides of the electronic component housing.

15. A system for supporting an electronic component in a flatpack package as recited in claim 14 wherein each of said depending legs comprises a depending body portion having a proximate end connected to one of said frame member means and lip means at the distal end of said body portion for engaging said carrier frame means at a corresponding one of said slot means.

16. A system for supporting an electronic component in a flatpack package as recited in claim 15 wherein said carrier frame means includes notched structure means positioned at each corner of the electronic component intermediate the terminals emanating from each side of the electronic component, said diagonal beam means engaging said notched structure means when said first and second engagement means lock said retention cover means to said carrier frame means.

17. A system for supporting an electronic component in a flatpack package as recited in claim 16 wherein said open frame means includes spaced depending leg means for engaging the component housing.

18. A system for supporting an electronic component in a flatpack package as recited in claim 13 wherein said legs in each set lie parallel to the axis and each set has counterfacing legs, the extensions of said legs including counterfacing camming surfaces, said removal tool camming means including symmetrically oblique surfaces with respect to the axis that are elevated above said base means and that intersect beyond the end of said removal tool means, the distance between said oblique surfaces and the camming surfaces decreasing as the carrier frame means moves along the axis, said symmetrically oblique surfaces engaging and displacing the counterfacing camming surfaces on said depending legs.

19. A system as recited in claim 18 wherein the carrier frame means has a central planar portion for supporting the electronic component and transverse edge portions parallel to the axis and terminating in a plane that is displaced from the planes of said depending legs, said spaced capture means including upstanding leg portions along the length of said removal tool parallel to the axis displaced from each other by a distance corresponding to the width of the carrier frame means and counterfacing lip means for overlying the transverse edge portions thereby to limit any motion of the carrier frame means normal to said base means.

20. A system as recited in claim 19 wherein camming means comprises a raised portion about the axis having an irregular octagonal shape about the axis that includes the symmetrically oblique surfaces, said raised portion having symmetry about both the axis and another axis transverse thereto and centered on said removal tool whereby said removal tool releases said retention cover means from the carrier frame means as the carrier frame means passes through said removal tool in either direction.

* * * * *